(12) United States Patent
Green

(10) Patent No.: US 7,122,083 B2
(45) Date of Patent: Oct. 17, 2006

(54) APPARATUS AND PROCESS USED IN GROWING CRYSTALS

(75) Inventor: Daniel Albert Green, Moylan, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 110 days.

(21) Appl. No.: 10/405,436

(22) Filed: Apr. 2, 2003

(65) Prior Publication Data
US 2004/0005255 A1    Jan. 8, 2004

Related U.S. Application Data

(60) Provisional application No. 60/369,664, filed on Apr. 2, 2002.

(51) Int. Cl.
*C30B 7/08* (2006.01)

(52) U.S. Cl. .................. 117/68; 117/69; 422/245.1; 422/253; 23/295 R

(58) Field of Classification Search ............. 422/245.1, 422/253; 23/295 R; 117/68, 69
See application file for complete search history.

(56) References Cited

U.S. PATENT DOCUMENTS

| | | | |
|---|---|---|---|
| 2,876,083 A | | 3/1959 | Prietl |
| 3,102,908 A | | 9/1963 | Raynes |
| 3,836,573 A | * | 9/1974 | Schreiber et al. .............. 560/78 |
| 4,113,658 A | * | 9/1978 | Geus ........................ 502/242 |
| 5,320,703 A | * | 6/1994 | Ikeda et al. ................... 117/68 |
| 6,001,176 A | * | 12/1999 | Leiter et al. ................ 117/206 |
| 6,464,736 B1 | * | 10/2002 | Hazen et al. ............. 23/295 R |
| 6,720,023 B1 | * | 4/2004 | Kim et al. ................. 427/2.27 |

FOREIGN PATENT DOCUMENTS

| | | |
|---|---|---|
| EP | 0 619 139 A | 10/1994 |
| WO | WO 90/11256 A | 10/1990 |
| WO | WO 92/20420 A | 11/1992 |
| WO | WO 95/26931 A | 10/1995 |

OTHER PUBLICATIONS

A.S. Myerson, ed., 1 st ed., Handbook of Industrial Crystallization. Butterworth-Heinemann Press (1993).
R.C. Bennett, "Crystallizer Selection and Design", in Handbook of Industrial Crystallization, A. S. Myerson, ed., pp. 103-130, 1st ed.
A. D. Randolph & M.A. Larson, Theory of Particulate Processes; Analysis and Techniques of Continuous Crystallization, 2nd ed., Academic Press San Diego (1998).
M.B. Shewin, R. Shinnar, & S. Katz, "Dynamic Behavior of the Well-Mixed Isothermal Crystallizer", AIChE Journal, 13 (6):1141-1154 (1967).
D.A. Green, "Crystallizer Mixing: Understanding and Modeling Crystallizer Mixing and Suspension Flow", in Handbook of Industrial Crystallization, 2nd. Ed., A.S. Myerson ed., Butter-Heinemann Press (2001).

(Continued)

*Primary Examiner*—Robert Kunemund

(57) ABSTRACT

This invention relates to a novel system for making uniform crystals. The system, by virtue of the nature of its crystal product, is useful in various chemical, pharmaceutical, agricultural, and biotechnology applications. The invention features physically separated and controlled crystal nucleation and growth zones useful in industrially scaled crystallization processes. The invention also provides a method to preferentially nucleate and crystallize a desired category of crystal structure (enantiomer, solvate, polymorph) of non-chiral and chiral compounds.

11 Claims, 9 Drawing Sheets

OTHER PUBLICATIONS

C.J. Price, "Ultrasound-The Key to Better Crystals for the Pharmaceutical Industry", Pharmaceutical Technology Europe, 9(10):78 (1997).

L.J. McCausland, P.W. Cains, P.D. Martin, "Use the Power of Sonocrystallization for Improved Properties", Chemical Engineering Progress, 97(7):56-61, (2001).

W.C. McCrone, "Polymorphism" in Physics and Chemistry of the Organic Solid State, vol. II, D. Fox et al. eds., Interscience (1965).

Patent Abstracts of Japan, vol. 009, No. 032, Feb. 9, 1985 & JP 59 179102 A, Mitsui Sekiyu Kagaku Kogyo KK, Oct. 11, 1984, Abstract.

Patent Abstracts of Japan, vol. 014, No. 030, Jan. 19, 1990, & JP 01 266804 A, Kobe Steel Ltd., Oct. 24, 1989, Abstract.

Patent Abstracts of Japan, vol. 018, No. 233, Apr. 28, 1994, & JP 06 024714 A, Central Glass Co. Ltd., Feb. 1, 1994, Abstract.

* cited by examiner

⊢ 100 μm

100 μm

APPARATUS AND PROCESS USED IN GROWING CRYSTALS

CROSS-REFERENCE TO RELATED APPLICATIONS

This application claims the benefit of U.S. Provisional Application Ser. No. 60/369,664, filed Apr. 2, 2002.

FIELD OF THE INVENTION

This invention relates to a novel system for making uniform crystals. The system, by virtue of the nature of its crystal product, is useful in various chemical, pharmaceutical, agricultural, and biotechnology applications. The invention features the use of physically separated and controlled crystal nucleation and growth in industrial crystallization processes.

BACKGROUND

High quality crystals are of great value for a variety of industrial and research applications. The ability to obtain a more tightly controlled particle size distribution as well as consistent and controlled crystal habit (shape) and structure (e.g., polymorph) is highly sought after, particularly in the biotechnology and pharmaceutical industries.

Crystallization is conventionally carried out in agitated tanks to which dissolved solute or reactants are fed. Crystals produced by these crystallizers are characterized by a wide particle size distribution (PSD). The distribution of particle size fluctuates because the various mechanisms governing the PSD are inherently nonlinear and depend strongly on process conditions. Therefore, slight changes in process conditions can cause large changes in PSD. Moreover, it has been difficult to predict the PSD of the produced crystals; so it is often impossible to even anticipate these PSD changes.

The PSD resulting from an industrial crystallization process is the product of the following mechanisms: nucleation, growth, aggregation, attrition, and breakage. However, in many cases crystallization can be approximated as a two step process: nucleation followed by crystal growth. This approximation is reasonably accurate in many cases of practical interest. (A. S. Myerson, ed., $1^{st}$ ed., *Handbook of Industrial Crystallization*. Butterworth-Heinemann Press (1993)). Nucleation is the key step, determining how many crystals are created and will participate in subsequent processes. In current crystallizers (R. C. Bennett, "Crystallizer Selection and Design", in *Handbook of Industrial Crystallization*, A. S. Myerson, ed., pages 103–130, $1^{st}$ ed.), nucleation and growth occur simultaneously and are controlled to a large degree by the same variables (A. D. Randolph & M. A. Larson, *Theory of Particulate Processes; Analysis and Techniques of Continuous Crystallization*, $2^{nd}$ ed., Academic Press, San Diego (1988)). For example, supersaturation, the most important variable affecting nucleation, also controls growth rate. Consequently, one process has to be suboptimized to manage the other. The combined processes therefore underperform what should be possible if nucleation and growth are separated and individually optimized.

It is well known in the art that "seeding" (i.e., the addition of small, prepared particles that suppress homogeneous nucleation and provide surfaces upon which solute precipitates) can be used to effect some degree of control over crystal nucleation, particularly for batch processes. Many existing batch processes benefit from the use of crystal seeding. However, seeding is often poorly managed, awkward, and even dangerous. To be completely effective, the form, quality, and PSD of crystal seeds must be tightly controlled.

In practice, seeding is often accomplished by leaving the "heel" from the previous batch in the vessel. This is simply a fraction of the suspension produced in the previous batch that contains crystals that will serve as seeds for the subsequent batch. Of course, the characteristics of these seeds vary greatly depending on the attributes of the previous batch. This heel partially redissolves under the best of conditions at the start of the next batch. In practice, it may happen that the heel completely dissolves, leaving no seed whatsoever for the subsequent batch. Furthermore, leaving the heel in the vessel decreases (often substantially) the capacity of the process. Optimally, seeds are specially treated, often finely ground material of constant quality. This usually involves adding bags of dry material to a batch at precisely the right moment (when the batch becomes saturated, but not supersaturated enough to nucleate spontaneously). This is labor-intensive and hard to manage at best. In addition, special equipment may be necessary, particularly when flammable or toxic solvents are used.

Crystallizers are frequently designed with the need for a skilled operator in mind. This skilled operator must carefully perform the necessary reactant contacting, cool the requisite volume of mother liquor, and create a well-mixed environment for crystallization to serve the dual purposes of dispersing feed streams into the crystallizing suspension (magma) and of suspending the existing particles uniformly. The human element has heretofore been essential to an efficient crystallization system, particularly when seeding is used.

The above problems exist in both continuous and batch processes. It is well known in the art that in a batch cooling crystallization the total mass of solute that precipitates is determined by the difference between the initial and final values of the solute concentration in the crystallizer solution (or mother liquor) multiplied by the total solution volume. If there is only nucleation and growth, and if this solute is precipitated onto comparatively few crystals, the mean crystal size will be large. Conversely, if this amount precipitates onto a relatively large number of crystals, the relative mean crystal size will be low. Including the effects of aggregation, attrition, and breakage makes the dependencies more complicated, but often does not substantially change the overall PSD.

Although conventional continuous crystallization processes are inherently "self-seeded" because there is always a crop of crystals present after initial start-up, there is little control over crystal form. Furthermore, the concentration of crystals in the vessel is typically not controlled. Consequences include oscillatory behavior (M. B. Sherwin, R. Shinnar, & S. Katz, "Dynamic Behavior of the Well-Mixed Isothermal Crystallizer", *AIChE Journal*, 13 (6):1141–1154 (1967)), and spontaneous changes in crystal form.

Typical continuous processes have a Residence Time Distribution (RTD). This means that the residence times of individual particles in the process vary about some median value. Therefore, while growing, the particles are subject to attrition and breakage for different lengths of time. This results in a distribution in particle size about a median value. Additionally, crystals grow at varying rates, known as Growth Rate Dispersion. This also contributes to the distribution of crystal size (A. D. Randolph & M. A. Larson, *Theory of Particulate Processes: Analysis and Techniques of Continuous Crystallization*, supra). In addition, the use of continuous crystallizers has been largely limited to large volume products because of the cost of installing a continuous process (R. C. Bennett, "Crystallizer Selection and Design", in *Handbook of Industrial Crystallization*, A. S. Myerson, ed., (1993), supra.

Effective mixing in relatively large single-tank crystallizers requires relatively large agitator power input and shear rate. While having the advantage of good mixing and solids distribution, this often leads to particle attrition and breakage and uncontrolled heterogeneous nucleation from the energetic particle-particle and particle-impeller collisions (D. A. Green, "Crystallizer Mixing: Understanding and Modeling Crystallizer Mixing and Suspension Flow", in *Handbook of Industrial Crystallization*, 2nd. ed., A. S. Myerson, ed., Butterworth-Heinemann Press, (2001)). Furthermore, the nucleation caused by the agitation and supersaturation is frequently not well controlled.

Ultrasound technology has been used to induce nucleation (C. J. Price, "Ultrasound—The Key to Better Crystals for the Pharmaceutical Industry", *Pharmaceutical Technology Europe*, 9(10):78 (1997); L. J. McCausland, P. W. Cains, P. D. Martin, "Use the Power of Sonocrystallization for Improved Properties", *Chemical Engineering Progress*, 97(7): 56–61, (2001)). When used in a conventional crystallizer, however, ultrasound often creates undesired fines. Ultrasound can only create additional nucleation. Therefore, its use (as outlined in these references) is only to provide additional nucleation in a specific location in the process. Nucleation occurring in the rest of the process is not controlled. The net effect is often to produce smaller crystals in a process, often not the desired result.

The crystals produced by the above processes may suffer from one or more of the following disadvantages: they flow poorly, cake upon shipping or storage, have a lower rate of dissolution, reaction and lower bioefficacy, and/or process poorly in subsequent steps. Moreover, many of these processes yield products with undesirable hazards, such as too many fines/dust, and/or an undesired crystal form. Significant problems are often caused when one crystal form uncontrollably converts to another. These include caking in storage, improper and (therefore unsafe) bioavailability, and process plugging (W. C. McCrone, "Polymorphism" in *Physics and Chemistry of the Organic Solid State*, vol. II, D. Fox et al. eds., Interscience (1965)). Finally, handling, using substandard crystals, and the undesired conversion of crystal form result in higher process costs.

It would be advantageous to develop an inexpensive process for the production of crystals by which nucleation and growth could be easily controlled and independently optimized to yield an exceptionally narrow particle size distribution of highly unified form.

SUMMARY OF THE INVENTION

The invention includes a process for generating crystals comprising (a) providing a flow of a first saturated solution past a front surface of a nucleation surface in a solution chamber; (b) cooling the nucleation surface with a chilled liquid contacting a back surface of the nucleation surface in a cooling chamber causing supersaturation of the solution at the front surface of the nucleation surface and causing a plurality of crystals to form on the front surface of the nucleation surface; (c) growing the crystals for a predetermined time to form a plurality of crystals of a desired size; (d) subjecting the nucleation surface to an ultrasonic pulse for a predetermined time to dislodge and release the plurality of crystals from the nucleation surface into the first saturated solution in the solution chamber; (e) passing the dislodged crystals and first saturated solution away from the nucleation surface; (f) repeating the growing step (c) and the ultrasonic pulse step (d) at least one time.

The step (b) (causing supersaturation) is accomplished preferably by cooling the nucleation surface with a chilled liquid contacting a back surface of the nucleation surface in a cooling chamber. Other methods of causing supersaturation include evaporating solvent from the first saturated solution, or adding chemical reactants, anti-solvent materials, or salt(s) to the first saturated solution.

Another embodiment of the invention involves forming the flow of the first saturated solution into a flat thin sheet of solution adjacent to the front surface of the nucleation surface in the solution chamber. In this embodiment, the flat sheet of solution has a thickness of less than about 0.12 inches and a width of more than about 8 times the thickness.

In a further embodiment of the invention step (d) comprises subjecting the nucleation surface to an ultrasonic pulse applied to the chilled liquid of step (b) or to the first saturated solution. The flow of the first saturated solution in step (a) is preferably directionally aligned with the force of gravity; and the passing of the dislodged crystals into the first saturated solution of step (e) is preferably directionally aligned with the force of gravity.

Another embodiment of the invention involves (a) generating dislodged crystals according to the process described above; (b) mixing the first saturated solution and dislodged crystals with a second saturated solution to form a third saturated solution; (c) treating the third saturated solution to form a supersaturated solution; and (d) passing the supersaturated solution of step (c) through a growth zone for a predetermined time to grow the dislodged crystals to a desired size under conditions of plug flow; and (e) separating the dislodged crystals of step (d) from the supersaturated solution while maintaining the third saturated solution at least saturated.

Alternatively, the process for growing crystals involves (b) treating the saturated solution and crystal nuclei to form a supersaturated solution; (c) passing the cooled supersaturated solution of step (c) through a growth zone for a predetermined time to grow the dislodged crystals to a desired size under conditions of plug flow; and separating the dislodged crystals of step (c) while maintaining the solution at least saturated.

In both of the processes for growing crystals, step (b) ("treating" the saturated solution to form a supersaturated solution) may be accomplished by i) cooling, ii) evaporating solvent from the third saturated solution, and/or iii) adding chemical reactants, anti-solvent materials, or salt(s) to the third saturated solution.

The invention also includes a crystal generator apparatus having (a) an inlet for flowing a crystal solution liquid, the inlet having an exit end; (b) a solution chamber attached to the exit end of the inlet, (c) a nucleation surface forming one surface of the solution chamber, the nucleation surface having a front surface for growing a plurality of crystals and a back surface; (d) a cooling chamber adjacent to the back surface of the nucleation surface for cooling the nucleation surface with a chilled liquid contacting the back surface of the nucleation surface, the cooling chamber having a liquid entrance port and a liquid exit port; (e) an ultrasonic horn arranged to vibrate the liquid contacting the nucleation surface; (f) a horn driver assembly connected to the ultrasonic horn for energizing the horn for a predetermined time and repeated at a predetermined interval to vibrate the liquid contacting the nucleation surface to dislodge the plurality of crystals from the nucleation surface; and (g) an outlet from the solution chamber for flowing the solution of the crystal solution liquid and crystals contained therein away therefrom.

The crystal generator also may include a solution chamber shaped to form a flat thin sheet of flowing solution adjacent the nucleation surface. The solution chamber may have a thickness of less than about 0.12 inches and a width of more than about 8 times the thickness, or an equivalent ratio of these dimensions. Additionally, the crystal generator may include (a) a diverging inlet diffuser for flowing a solution of the crystal media, the diffuser having a width at an exit end larger than at an entrance end of the diffuser; (b) a solution chamber attached to the exit end of the inlet diffuser, the solution chamber shaped to form a flat thin sheet of flowing solution wherein the chamber has a thickness less than about 0.12 inches and a width more than about 8 times the thickness, the thickness and width of the solution chamber matching the thickness and width of the exit end of the inlet diffuser; (c) a nucleation surface forming one surface of the solution chamber width, the nucleation surface having a front surface for a plurality of crystals and a back surface; (d) a cooling chamber adjacent to the back surface of the nucleation surface for cooling the nucleation surface with a chilled liquid contacting the back surface of the nucleation surface, the cooling chamber having a liquid entrance port and a liquid exit port; (e) an ultrasonic horn extending or penetrating into the cooling chamber; (f) a horn driver assembly connected to the ultrasonic horn for energizing the horn (thereby vibrating the chilled liquid and the nucleation surface contacted by the liquid for a predetermined time and repeated at a predetermined interval to dislodge the plurality of crystals from the nucleation surface); (g) a converging outlet diffuser for flowing a solution of the crystal media and crystals contained therein away from the solution chamber, the diffuser having a thickness and a width at an entrance end of the diffuser, the thickness and width of the entrance end of the diffuser approximately matching the thickness and width of the solution chamber.

The nucleation surface of the invention may comprise a molecular nucleation template. Examples of molecular nucleation template are a surfactant film, a self-assembled monolayer, or a molecularly imprinted polymer.

BRIEF DESCRIPTION OF THE FIGURES

The invention can be more fully understood from the figures, the detailed description, and claims which together constitute this application.

DETAILED DESCRIPTION OF THE INVENTION

Figure 1A:
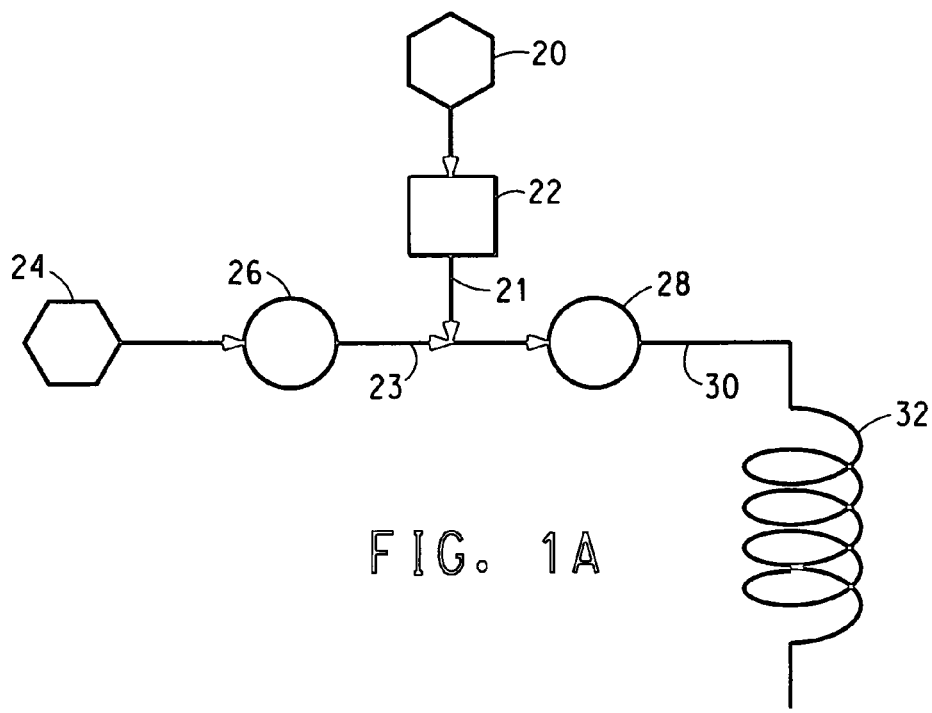
FIGS. 1a, 1b, and 1c show schematic variations of the crystal growth system.

The present invention involves a very simple, easily controlled, and inexpensive process to produce crystals that permits an exceptionally narrow PSD. The invention achieves this outcome by physically separating the crystal nucleation and growth zones. In this manner the invention provides for control of process conditions in each zone independent of the other to create optimum conditions for their respective processes, while minimizing crystal damage. To fully realize the advantages of controlling crystal nucleation, the control of nucleating must be combined with control of growth zone conditions. In the nucleation zone, supersaturation may be relatively high to favor nucleation over growth. In the growth zone, however, supersaturation and the agitation/flow rates and suspension densities may be relatively low to favor growth over nucleation. Nucleation and crystal growth are separated by creating a "crystal nuclei generator" (NG) separate from an enhanced crystal growth zone (GZ).

The dual abilities to produce desired crystal forms (polymorph, enantiomer, or solvate), as well as to control particle size distribution are of high value to various chemical industries. In particular, the pharmaceutical industry seeks such control in light of FDA registration mandates.

Recognized methods of generating supersaturation in industrial crystallization and precipitation processes include cooling, solvent evaporation, in situ chemical reaction, antisolvent addition, and "salting-out" (the addition of another salt with a common ion). The preferred embodiment of this invention is to generate supersaturation by solution cooling; however, other methods can be used, particularly to generate supersaturation for the growth zone. Cooling of the nucleation surface in the crystal nuclei generator creates supersaturation exactly at the point where it is desired, at the nucleation site itself. This is particularly valuable when crystal nucleation templates are applied to the nucleation surface, as described below. To employ other methods of generating supersaturation, it will be beneficial to create the supersaturation as near to the nucleation surface as possible, e.g., mixing of chemical reactants or of an antisolvent into the solution should be done in such a way that the mixed stream is immediately exposed to the nucleation surface. Since there is no such consideration for the growth zone, it is much more amenable to non-cooling methods of generating supersaturation. A mixing or evaporation zone could supersaturate the solution at the entry to the growth zone, or reactants or antisolvents (for example) can be mixed in at several locations along the length of the growth zone to moderate local maxima in supersaturation.

The present invention is described in detail with respect to processes and compositions. (As used herein, by crystal nuclei, or nuclei, is meant any small particle of matter which can serve as the nucleus of crystal structure growth.) The present invention would benefit both continuous and batch crystallizations. In both formats the goal is to produce a stream of uniform nuclei crystal seeds. The growth zone concepts discussed apply mainly to continuous crystallization, but the skilled artisan will recognize that the system of the present invention can be simply adapted to batch processes as well. For example, nuclei from a generator could be fed to a conventional batch crystallizer that has been filled with saturated solution. Supersaturation would then be generated in the entire charge (now containing nuclei), for example by cooling.

Nuclei would be fed to the subsequent growth zone in a liquid suspension. The examples presented used adipic acid and glycine as model compounds. However, the present processes have broad applications and individuals skilled in the art will recognize the utility of the present invention to any processes in which narrow PSD and/or control of other crystal characteristics are desired. Furthermore, the process of the present invention should be predictive of success at different production scales, from lab to pilot plant to manufacturing scale.

In the apparatus for producing embodiments of the present process, nucleation occurs in a small, high supersaturation zone where a high number of very small, very uniform crystals are produced. These crystals are used to seed a crystal growth zone. Growth zone conditions are optimized, independent of the nucleation zone, to foster uniform growth while limiting or eliminating additional nucleation and particle damage. These conditions include moderate supersaturation, low agitation and associated shear rates, and minimized residence time distribution. In comparison to conventional crystallization processes, a uniform crop of seeds or nuclei are produced which are grown uniformly for the same length of time and therefore high quality crystals of desired PSD and crystal structure, with essentially no fines, are obtained.

The basic invention uses a chilled nucleation surface and an ultrasonic device to dislodge crystals from the nucleation surface. The device may comprise a chilled nucleation surface mounted to the side of a large process pipeline, or a small-scale pipeline having a chilled nucleation surface with the small pipeline feeding into a larger process pipeline. The ultrasonic horn may be contacting the chilling liquid to vibrate the nucleation surface or may be contacting the solution liquid to vibrate the nucleation surface.

The present invention provides for a particular design of nuclei generator, in which a uniform stream of saturated solution is exposed to a chilled solid surface while in rectilinear flow that may be adapted to the use of molecular template directed nucleation (TDN). In TDN, nucleation occurs at a surface chosen because the molecular structure of the surface enhances nucleation in some way. For example, a molecular monolayer may have some attributes of a facet of the crystals nucleating, reducing the activation energy for nucleation onto the surface, and also potentially imparting some degree of organization to the nucleating molecules. The reduction of activation energy of nucleation at the template means that nucleation occurs preferentially on these surfaces. (E. M. Landau, S. G. Wolf, M. Deutsch, K. Kjaer, J. Als-Nielsen, L. Leiserowitz, M. Lahav, "Design and Surface Synchrotron X-Ray Structure Analysis of Langmuir Films for Crystal Nucleation", *Pure & Appl. Chem;* 61(4):673–684 (1989).) Accordingly, nucleation will usually occur at a lower supersaturation than for homogeneous nucleation and thus the template affords more control over the nucleation process.

Molecular nucleation templates can take the form of surfactant films at air/solution interfaces (Langmuir films) or adsorbed on solid substrates (Langmuir-Blodgett films). Of particular interest to this invention is the use of "self-assembled monolayers" (SAMs). These are chemically bound surfactant monolayers on solid substrates. A SAM can be used to form the template (G. M. Whitesides, J. P. Mathias, C. T. Seto, "Molecular Self-Assembly and Nanochemistry: A Chemical Strategy for the Synthesis of Nanostructures", *Science* 254(29):1312–1319 (1991)). For instance, if the nucleation surface 46 (see FIG. 4) were coated with a gold layer, an appropriate long chain alkanethiol (an organic compound containing sulfur) can be applied directly to the gold surface where it would self-assemble into a nucleation template. Other compound/substrate systems are also known to form SAMs (e.g. trichlorosilanes on silica substrates: either glass or the native oxide layer on silicon). Alternately, molecularly imprinted polymer films could be used as nucleation templates. (S. M. D'Souza, C. Alexander, S. W. Carr, A. M. Waller, M. J. Whitcombe, E. N. Vulfson, "Directed Nucleation of Calcite at a Crystal-Imprinted Polymer Surface", *Nature* 398(25): 312–316 (1999)) or appropriate crystal faces of another compound (P. W. Carter, M. D. Ward, "Topographically Directed Nucleation of Organic Crystals on Molecular Single-Crystal Substrates", *J. American Chemical Society,* 115:11521–11535 (1993)).

If the nucleation template is carefully chosen or designed, the crystal form of the nucleating species can be selected. By crystal form, is meant the particular crystal structure or polymorph, enantiomer, or solvate of the nucleated crystal. Carter and Ward have demonstrated polymorph selection of an organic with SAMs (P. W. Carter, M. D. Ward, "Directing Polymorph Selectivity During Nucleation of Anthranilic Acid on Molecular Substrates", *J. American Chemical Society,* 116:769–770 (1994)). Mann et al. have demonstrated the ability to select the polymorph of calcium carbonate which nucleates and grows using Langmuir films (S. Mann, B. R. Heywood, S. Rajam, J. D. Birchall, "Interfacial Control of Nucleation of Calcium Carbonate under Organized Stearic Acid Monolayers", *Proceedings of the Royal Society London,* A, 423:457–471 (1989)). This selectivity may be extended to crystal solvate selection.

Thus, by incorporating TDN, the present invention will reliably produce only desired crystal forms. If the desired form is produced in the crystal nuclei, it frequently follows that further crystal growth will maintain the same crystal form, be it polymorph, enantiomer, or solvate. This selectivity is extremely important for the pharmaceutical industry in particular because the FDA mandates that only the registered polymorph can be produced. Example 5 ("Template-Directed Nucleation on Self-Assembled Monolayer in Nuclei Generator) demonstrated that TDN is a practical application of the present invention. Crystals nucleated at the nucleation template on the front surface of the nucleating surface as was desired. The crystals were released by ultrasonic pulses, producing crystals 2–5 microns in size.

The skilled artisan will recognize that the method of the present invention could be used to preferentially nucleate and grow the desired enantiomer of other chiral and conformationally chiral compounds including but not limited to amino acids, such as alanine and glycine, other organic acids, and pharmaceutical and agricultural chemicals. Example 6 sets out a prophetic protocol for obtaining a selected enantiomer of a conformationally chiral crystal. In that protocol, asymmetric self-assembled monolayers derived from R, L cysteine are used to preferentially nucleate only one of the conformational enantiomers of glycine. (Glycine crystals are chiral even though the glycine molecule is not because of asymmetry imposed by the crystal structure.)

Crystal polymorph selection is also possible. For example, three crystal polymorphs of glycine are known. These are identified as the $\alpha$, $\beta$, and $\gamma$ forms. The $\alpha$ form is thermodynamically stable at ambient conditions and is the form that normally crystallizes. The present invention provides for a method that uses an amino acid terminated self-assembled monolayer (SAM) in the nuclei generator apparatus to preferentially nucleate the γ form under conditions which would otherwise nucleate only the α form. These and other features and advantages will be apparent to those skilled in the art in view of the drawings and examples that follow.

The major components of an apparatus for performing embodiments of the present invention are shown in FIGS. 1–4. The apparatus comprises the following major elements; one or more sources of solution; the means to achieve and control supersaturation (e.g., by cooling the solution in heat exchangers); a nuclei generator; a growth zone; and a collection or product recovery system.

Growth Zone Process:

FIG. 1A shows a preferred system for growing uniform crystals. A saturated solution comes from a first feed stream source 20 and flows to a small volume nuclei generator 22 that utilizes a chilled surface and pulsed ultrasound to produce seed crystals or nuclei. The device uses ultrasound not to cause or control nucleation, but rather merely to remove nuclei that have already formed from the chilled solid surface of the device. These seed crystals and solution then exit the nuclei generator in a stream 21 and are then fed to a stream 23 of fluid coming from a second saturated solution feed source 24 which is chilled by chiller 26 to maintain or achieve saturation or low supersaturation. The sources of feed solution 20 and 24 can either be separate sources or a single source, in which case the nuclei generator loop is effectively a side stream. The seed crystals in the saturated solution from the nuclei generator are introduced into the flow after chiller 26 and before chiller 28 to form a third stream 30. It is important that the seed crystals do not dissolve when joining the second feed source stream. Plug flow is established in the flowing third stream 30 after chiller 28 that creates a controlled supersaturation for crystal growth without additional nucleation. The supersaturated third stream enters a length of tubing 32 which serves as a growth zone for the controlled supersaturated fluid and seed crystals.

In the process of the present invention where supersaturated first feed stream source 20 is generated by chemical reaction, the two reactant streams may be very rapidly and intimately mixed by methods well known in the art. These methods include but are not limited to a high shear (highly turbulent) T-mixer. The growth zone 32 helps to grow the seed particles as uniformly as possible. Preferably, the growth zone is a simple pipeline. A skilled artisan may consider the following:

1. Choose the length and diameter of the pipeline based on the total residence time needed to achieve the desired average particle size and the average process throughput;

2. Since the supersaturation will fall as the particles grow if the temperature is maintained constant, adjust the temperature along the length of the tube to control the supersaturation. Alternately, additional solution or antisolvent is fed into the pipe at intervals;

3. Flow is as nearly "plug flow" as possible; therefore turbulent flow, with its flat velocity profile over most of the tube diameter, is desired;

4. Mix well radially so that each particle encounters approximately the same supersaturation condition and hence, grows uniformly. Mixing intensity, however, should be minimized so that generating nuclei by contact nucleation and particle breakage and attrition are minimized;

5. Direct the growth zone effluent containing the final product crystals to a traditional solid/liquid separation (e.g., filtration) and/or subsequent processing.

Size-Selective Process

As an alternative to the growth zone process shown schematically in FIG. 1A, a size-selective process could be used to grow particles and then harvest only those that have grown to a sufficient size. The harvesting may be done with a size-selection means such as an external elutriator. For example, in FIG. 1B the growth zone 32a could be comprised of a tank 33 agitated with one or several impellers 31, into which the main process stream 30a from a second solution source 24a and the stream 21 from the nuclei generator 22 containing the seed crystals are fed. A first solution source 20 feeds saturated solution to the nuclei generator 22. Again, as above, the solution sources 20 and 24a can be the same source. Supersaturation would be maintained in the tank 33 at a preset value (e.g., by providing additional solution cooling through the use of a vessel jacket or cooling coil). Suspension would be removed in line 34 from the tank 33 and circulated through an external size selection device 35 from which particles larger than a particular size would be removed as stream 37, while smaller crystals and the remaining process mother liquor would be returned to the agitated tank in line 36. The external size-selection device 35 could be, for example, an elutriator or a hydrocyclone. An internal size-selection device such as the annular settling zone in the well known draft-tube baffled (DTB) crystallizer (R. C. Bennett, "Crystallizer Selection and Design", in *Handbook of Industrial Crystallization*, A. S. Myerson ed., $1^{st}$ ed., supra could also be used.

Figure 1B:
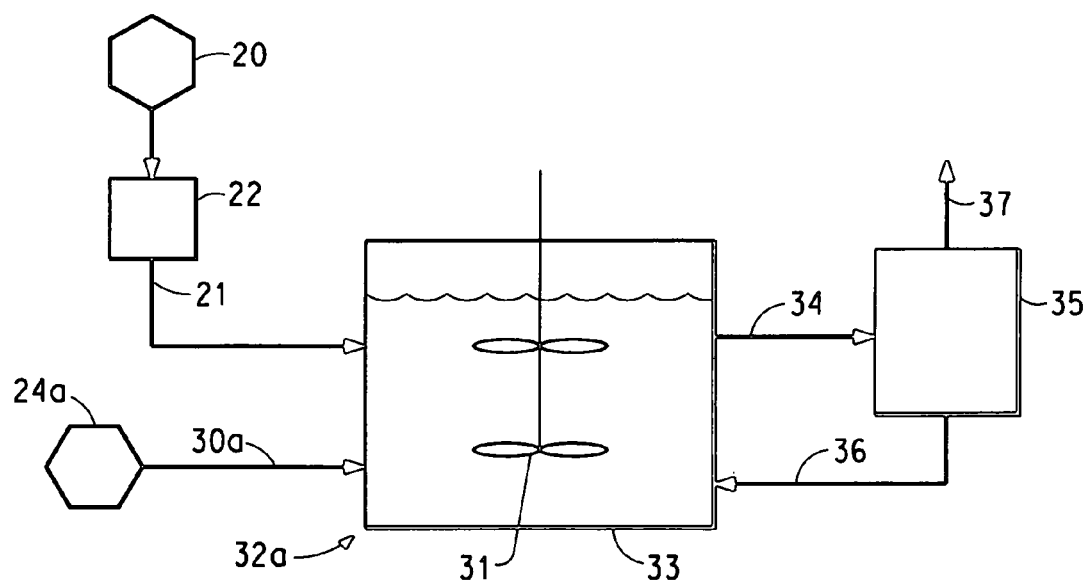
Figure 1C:
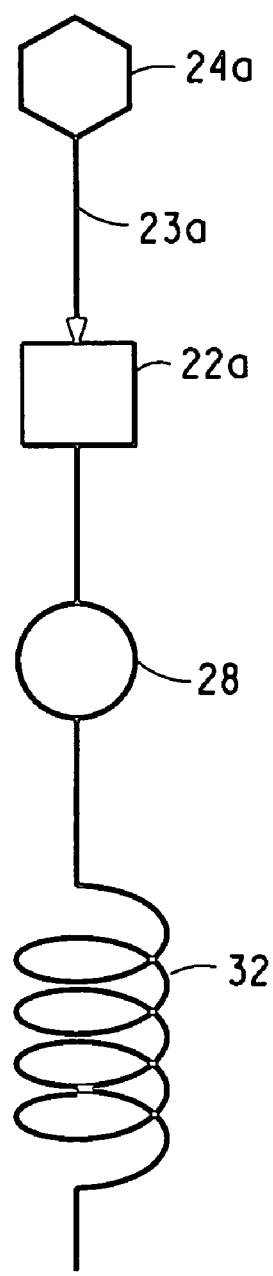

FIG. 1C shows a further alternative to FIG. 1, where 24a is the sole solution source, and all of the solution passes as stream 23a to the nuclei generator 22a. This implementation of the nuclei generator differs from that described in FIG. 1A in there can be significant passage of solute through the device without contacting the nucleation surface 46 detailed in FIG. 3. The solution and nuclei may proceed to a cooler 28 and growth zone 32 as in FIG. 1A.

Figure 2:
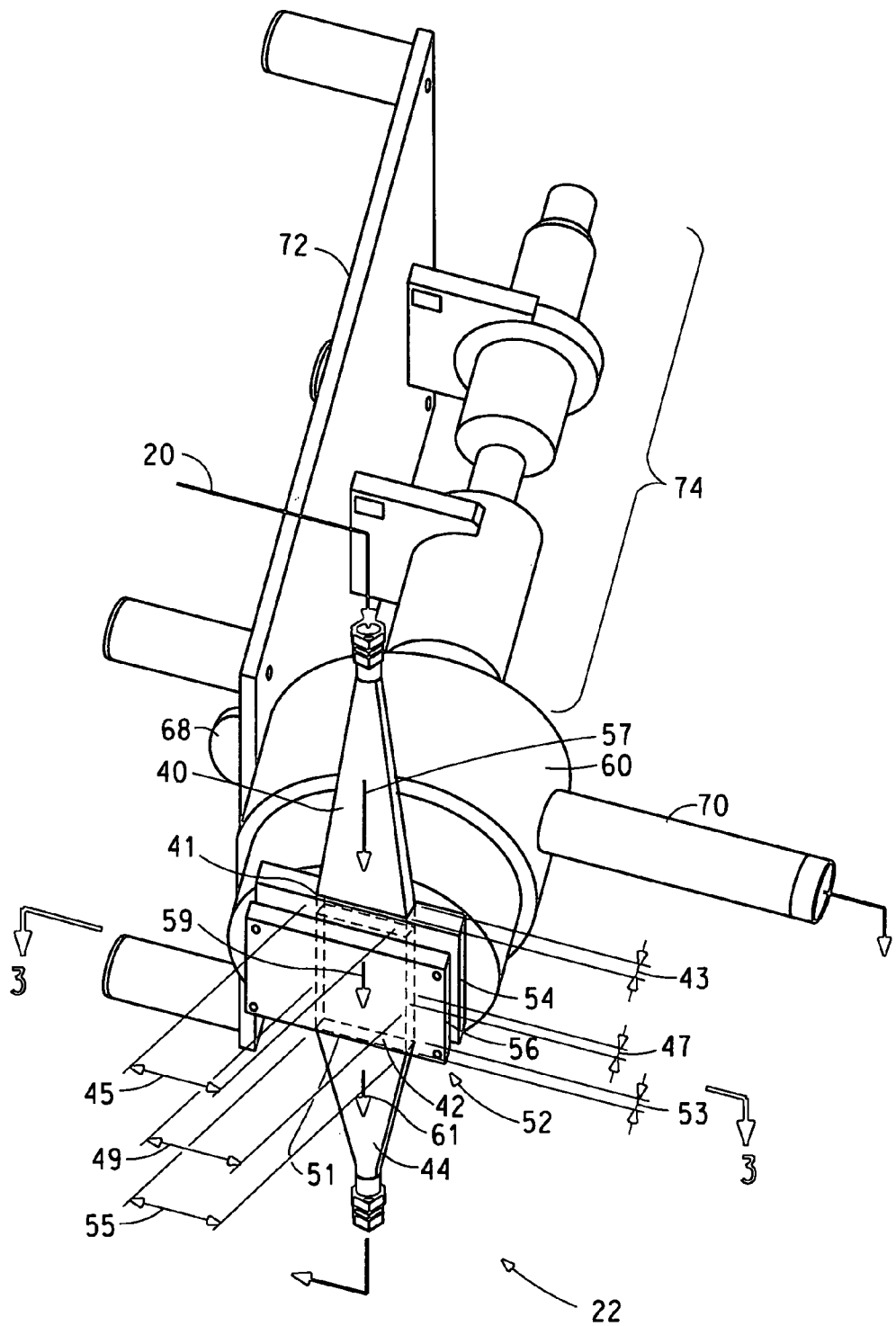
FIG. 2 shows a perspective view of one embodiment of the crystal nucleation device.
Figure 3:
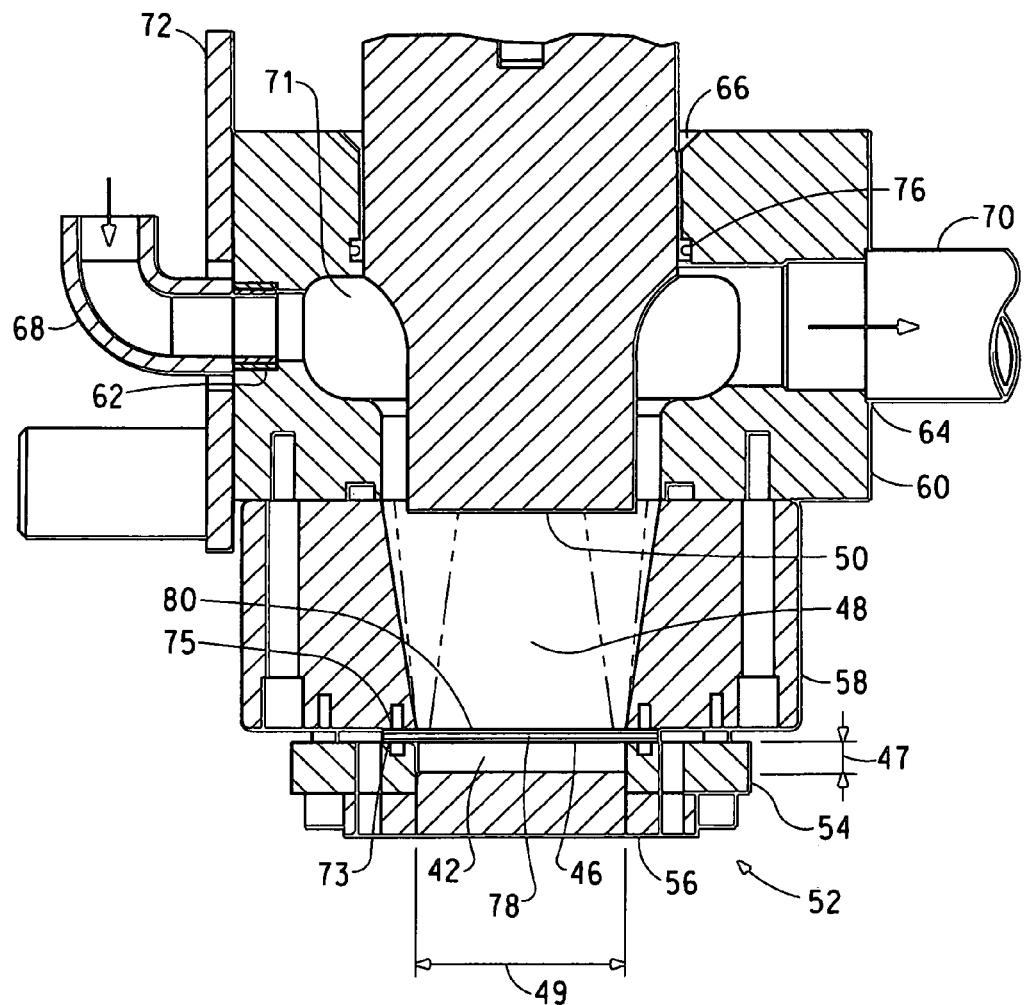
FIG. 3 shows a partial section view 3—3 from FIG. 2.

FIGS. 2 and 3 show in greater detail the nuclei generator that could be used in the process illustrated by FIGS. 1A, and 1B. The nuclei generator comprises a diverging inlet diffuser section 40, a solution chamber 42, a converging outlet diffuser section 44, a relatively thin sheet 78 whose front surface serves as the nucleation surface 46, a cooling chamber 48, and an ultrasonic horn 50. The solution chamber 42 is contained in a housing 52 comprising a rectangular frame 54 covered on one side by a transparent plate 56 and on the other side by the nucleation surface 46. The cooling chamber 48 is contained in a cooling housing 58 covered on one side by the rectangular thin sheet 78 forming the nucleation surface 46 and on the other side by cooling fluid block 60. The cooling fluid block 60 has a fluid entrance port 62, a fluid exit port 64, and an ultrasonic horn orifice 66. An entrance conduit 68 is sealingly engaged in the entrance port 62 and an exit conduit 70 is sealingly engaged in the exit port 64. The cooling fluid block 60 has a cooling fluid passage 71 surrounding horn 50 and block 60 is mounted to a frame 72. The ultrasonic horn 50 is circular in cross-section and is mounted to a horn driver assembly 74 that is mounted on frame 72. The ultrasonic horn 50 has a close sliding fit in cylindrical orifice 66 and passes through a seal 76 that acts to seal cooling fluid in passage 71 against leakage past the horn 50. The seal 76 is located at a longitudinal vibrational node point along the length of the ultrasonic horn so excessive frictional sliding does not occur at the seal. The transition from the circular cross-section of the ultrasound horn to the rectangular thin sheet 78 forming the nucleation surface 46 and frame 54 is accomplished by the cooling fluid block. The thin sheet 78 has a seal 73 and a seal 75 around its perimeter surfaces to prevent leakage of cooling fluid and solution.

The diverging inlet diffuser 40 has an exit end 41 that has a thickness 43 and a width 45. The diffuser exit end 41 is in fluid communication with the solution chamber 42. The thickness 43 and width 45 of the exit end 41 of the inlet diffuser 40 approximately matches a thickness 47 and a width 49 of the solution chamber 42.

Generally, a goal of the nuclei generator is to bring much of the solute in the solution flow into proximity of the nucleation surface. The dimensions of the solution chamber are determined by considering the mass transport of solute to the nucleation surface. If the total length is small, the chamber should be relatively thin, so that solute can be transported from the bulk of the stream to the nucleation surface. If, however, the length of the zone is long, the chamber can be thicker because convective and diffusional mass transport over the length of the device will give much of the solute in the stream access to the nucleation surface. Correspondingly, the nature of the flow in the solution chamber will affect the chamber dimensions. Turbulent flow, which has far better transverse mixing than laminar flow, requires a much less narrow solution chamber.

The thickness of the solution chamber is thin to promote good contact between the solution and the nucleation surface. For example, in one embodiment the thickness of the solution chamber may not exceed about 0.12 inch and the width of the solution chamber will have a dimension that exceeds about 8 times the width dimension so that a broad flat sheet of turbulent flowing solution can contact the nucleation surface intimately and be cooled. However, as described herein and in FIG. 1C, in some cases the nuclei generator can be operated such that much solute bypasses the nucleation surface and only a relatively small fraction is brought into its proximity. In this case, of course, the solution chamber can be made relatively thicker.

The converging outlet diffuser 44 has an entrance end 51 that has a thickness 53 and a width 55. The thickness 53 and width 55 of the entrance end 51 of the outlet diffuser 44 matches the thickness 47 and the width 49 of the solution chamber 42. The vertically oriented outlet diffuser should be free of horizontal surfaces that may trap seed crystals leaving the solution chamber 42.

In operation, first feed stream source 20 flows into inlet diffuser section 40 and flows into the solution chamber 42 past a front surface 46 of the thin sheet 78 and out through outlet diffuser section 44. The front surface 46 of the thin sheet 78 should preferably be an impermeable surface.

The nucleation surface may have several configurations. First, it can be a simple bare surface of a material chosen for its ability to nucleate and then release nuclei when sonified. A wide variety of materials can be used. In the examples, the use of both metal (stainless steel) and polymer (polyethylene) surfaces are disclosed. In addition, template-directed nucleation can be employed (as described above). In the preferred embodiment, a self-assembled monolayer is applied to a suitable substrate (e.g., a gold layer deposited on a suitable base surface). The nucleation surface can also be a molecularly imprinted polymer (MIP) or contain suitable crystal surfaces of another material to serve as a nucleation template. In addition, a micro- or nano-patterned monolayer can be used as a nucleation template. In this embodiment, small active sites are interspersed in an inactive matrix. The matrix can be active and the islands inert. The purpose of these patterned templates is to further effect control of particle size and nucleation. Typical nucleation surface base materials are relatively thin sections of stainless steel, silicon wafer, polyethylene, or poly(tetrafluoroethylene) (Teflon®) that can be subjected to ultrasonic energy and through which ultrasonic energy can be coupled to the solution. A thin layer of, for example, gold can be applied for the purpose of affixing self-assembled monolayers (e.g., monolayers of alkanethiols). In another embodiment, nucleation is desired primarily on the chilled front surface 46 where the solution reaches a controlled supersaturation and residence time can be controlled. It is preferred that significant nucleation be absent from the solution far from the chilling effects of the surface where supersaturation and residence time are less controlled. Cooling fluid from a refrigerated bath (not shown) flows in through conduit 68, port 62. The cooling fluid then continues around the ultrasound horn 50 through passage 71 to cooling chamber 48, past the back surface 80 of the thin sheet 78, and exits the device at port 64 and out through conduit 70 to return to the refrigerated bath.

The solution flowing into diffuser section 40 travels in a long, gradually diverging passage to provide a uniform rectilinear flow without recirculating eddies that are more likely to occur with a rapidly diverging passage. Exiting the solution chamber, the solution travels through diffuser section 44 in a short converging passage to minimize the volume and the residence time of the fluid transitioning out of the solution chamber.

The saturated solution from source 20 in the solution chamber is rapidly cooled and becomes supersaturated as it contacts front surface 46 and crystal nuclei rapidly form on the front surface 46. After a first predetermined period of time, during which a desired nuclei size is formed on the nucleation surface 46, the ultrasonic horn 50 is energized by driver assembly 74 for a second predetermined period of time to dislodge the seed crystals from the front surface 46 of the thin sheet 78. The ultrasonic energy is transmitted through the cooling fluid in cooling chamber 48 and impinges on surface 80 of nucleation surface 46. The dislodged crystal seeds are carried away by the flow of fluid in solution chamber 42 downward through outlet diffuser 44. The transparent plate 56 allows one to observe the forming and dislodging of crystals in the solution chamber during operation of this prototype device. If measuring the size of the crystals is desired, the suspension can be run over a hydrophobic surface (e.g. the surface of a plastic Petri dish), to which the crystals tend to stick and the solution flows off. In this way, the crystals are rapidly separated from the supersaturated solution. Otherwise, they grow rapidly and any measure of their particle size will reflect this growth.

The nuclei generator 22 has the inlet diffuser section 40, solution chamber 42, and outlet diffuser section 44 preferably oriented in a vertical arrangement as shown. The flow path of the solution (indicated by arrows 57, 59, and 61) is aligned with the force of gravity so that the small crystals fall downward out of the solution chamber and outlet diffuser 44 under the influence of gravity and with the solution flow. The crystals do not collect on horizontal surfaces as they might do if the inlet diffuser section 40, solution chamber 42, and outlet diffuser 44 were arranged horizontally. In cases where solution flow is high enough to keep small particles suspended, a vertical orientation is less important for clearing crystals out of the solution chamber and may not be necessary.

The solution chamber 42 is of a relatively small volume to focus the nucleation at the nucleation surface, the front surface 46 of thin sheet 78, and to discourage nuclei formation within the solution remote from the nucleation surface 46. Volume in the nuclei generator 22 should be small for two reasons. First, most of the mass of the ultimate particles will be added during growth, not nucleation, so the mass of solute in the nuclei stream is very small compared to the total solute throughput. Second, a small volume will maximize mixing and spatial uniformity in the zone where nucleation occurs.

The nuclei generator 22 produces a stream of small, uniform crystals suspended in solution. The size and character of these crystals can be controlled by the process parameters: feed solution concentration and temperature, temperature of the chilled surface, and intensity and pulse rate of the ultrasound. For example, the exit temperature measured for the solution flowing through the nuclei generator could be 29.3° C. This corresponds to a maximum dimensionless supersaturation, $\sigma^{max}$=0.28, where $\sigma^{max}=(c_o - c_{eq}^{29.3° C.})/c_{eq}^{29.3° C.}$, $c_o$ is the inlet concentration, and $c_{eq}^{29.3° C.}$ is the equilibrium or saturation concentration at the exit of the nuclei generator at 29.3° C. This is a maximum value for these conditions because it assumes that the solution comes to equilibrium at 29.3° C. (i.e., crystal nucleation and growth have relieved all the supersaturation). Since the solution is likely still supersaturated at the exit of the solution chamber 51, the actual value for the dimensionless supersaturation would be less.

The dislodging sound waves useful in the invention may range from a frequency of 60 kHz down to about 20 Hz.

In one embodiment of the present invention, two relative supersaturations were run by diluting the stream 21 exiting the nuclei generator running in the configuration shown in FIG. 1C. Expressed as ratios of the dimensionless supersaturation with and without dilution, these supersaturations were $\sigma_{diluted}/\sigma_{undiluted}$=0.5 and 0.75, respectively. The results (described in Example 4 and FIGS. 8a and 8b) indicate that the size and quality of the crystals produced by this process can be controlled by controlling the supersaturation in the growth zone.

Figure 4:
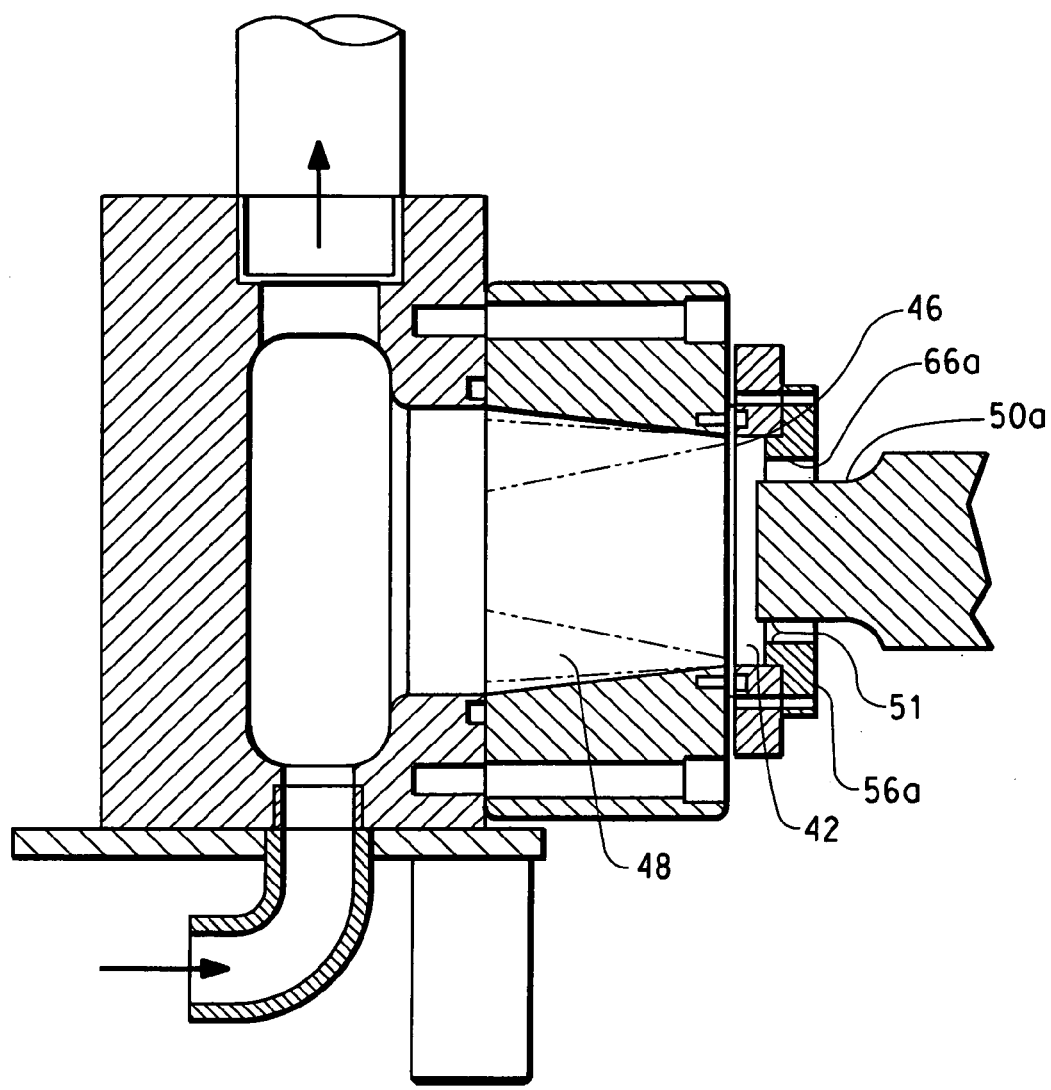
FIG. 4 shows a variation of the crystal nucleation device shown in FIGS. 2 and 3, wherein ultrasound couples through the solution instead of a cooling liquid.

An alternative embodiment to the nuclei generator of FIGS. 2 and 3 is shown in FIG. 4, where the ultrasonic horn 50a is contacting the solution liquid in the solution chamber 42. The ultrasonic energy is transmitted through the solution liquid to vibrate the nucleation surface 46 rather than transmitted through the cooling liquid in the cooling chamber 48. The plate 56a has an orifice 66a for the ultrasonic horn 50a. A convoluted seal 51 seals against leakage of the solution between the horn 50a and plate orifice 66a. It is believed this type of seal can accommodate the vibration of the horn 50a without excessive wear or heating even though it may not be at a node point for the horn.

In laboratory implementation, the entire solution flow goes through the nuclei generator and the supersaturation is created by the heat transfer in the nuclei generator. In full scale equipment, additional heat transfer area outside the nuclei generator may be added. In this manner, the heat transfer is applied directly to the growth zone 32 or as a chiller 28.

There has thus been described an apparatus and process for producing desired crystals with an exceptionally narrow particle size distribution. The process is simple, inexpensive, permits process control, provides conditions for minimal particle damage and finally, permits the use of template directed nucleation.

EXAMPLES

The present invention is further defined in the following Examples presenting the details of the procedures that were followed in its development and validation. It should be understood that these Examples, while indicating preferred embodiments of the invention, are given by way of illustration only. From the above discussion and these Examples, one skilled in the art can ascertain the essential characteristics of this invention, and without departing from the spirit and scope thereof, can make various changes and modifications of the invention to adapt it to various uses and conditions.

The meaning of abbreviations is as follows: "h" means hour(s), "min" means minute(s), "sec" means second(s), "d" means day(s), "µL" means microliter, "mL" means milliliters, "L" means liters, "µm" means micrometer, "ppm" means parts per million, i.e., milligrams per liter.

Example 1

Production of Very Small Uniform Crystals Suitable for Use as Seed Crystals Produced in Nuclei Generator The prototype nuclei generator shown in FIG. 2 and in cross-section in FIG. 3 was employed. A thin (0.035"/0.889 mm) sheet of stainless steel was used as the nucleating surface (separating the solution and cooling chambers). The area of the sheet was 26 cm². An aqueous solution of adipic acid was prepared at 32 g/L adipic acid, corresponding to the saturation concentration at 35° C. Water at 5° C. was circulated through the cooling chamber from a constant temperature/circulator bath. The adipic acid solution was pumped through the nuclei generator with a peristaltic pump at 50 mL/min. Pulsed 20 kHz ultrasound was applied to the cooling chamber side of the nucleation surface from an ultrasonic horn driven by a Dukane 1000 Autotrac controller and transducer (Dukane Corporation, St. Charles, Ill.) operated at 40% power, nominally 400 watts. A 2 sec ultrasound pulse was applied every 20 sec. The device was mounted so that the net flow of solution through the device was vertically downward. Nuclei formed on the nucleation surface, were disengaged by the ultrasound pulses; then conveyed out of the apparatus as a suspension of crystals with the solution flow.

At the exit of the device, crystals were sampled by directing the suspension onto a tilted hydrophobic plastic surface. The aqueous solution beaded on the plastic surface and rolled off; some of the crystals remained attached. This effectively separated the crystals from the now supersaturated solution and stopped their growth. The plastic surface was placed under an optical microscope and the crystals were characterized from the resulting micrographs. Based on microscopy, average particle size produced was 5 µm, with a relatively narrow particle size distribution.

Example 2

Tubular Nucleation Zone

In another embodiment of the "nuclei generator", a 24 inch length of ¼ inch outer diameter, ⅛ inch inner diameter polyethylene tube was immersed in an ultrasonic bath (Crest Trusweep Genesis, Crest Ultrasonics, Trenton, N.J.) filled with water maintained at 5° C. with a refrigerated circulator bath. Aqueous adipic acid solution at a concentration of 32 g/L, initially at 37° C., was pumped through the tubing with a peristaltic pump at a flow rate of 50 mL/min. In previous chilled tube experiments, significant crystal deposition on the tube inner wall was observed. When the exterior of the immersed tube is subjected to pulsed ultrasound in the ultrasonic bath (2 sec pulse every 30 sec), however, no crystal deposition is observed on the inner tube wall. A suspension of uniform small particles is collected. Sampling the particles on a hydrophobic surface, as described above, would show very uniform small particles approximately 10 µm in size.

Example 3

Nuclei Generator Coupled With Crystal Growth Zone to Produce Very Uniformly Sized Crystals Adipic acid solution, 32 g/L (corresponding to saturation at 35° C.), was fed to the prototype nuclei generator (described in Example 1) at 54.5 mL/min and 37° C. Cooling water was fed to the nuclei generator at 5° C. Ultrasound was applied for a 2 sec pulse every 15 sec; power at 40%. The nucleation surface was clean polyethylene. The exit temperature measured for the solution flowing through the nuclei generator was approximately 29.3° C. This corresponds to a maximum dimensionless supersaturation, $\sigma_{max}=0.28$, where $\sigma_{max}=(c_o-c_{eq}^{29.3°\,C.})/c_{eq}^{29.3°\,C.}$, $c_o$ is the inlet concentration, and $c_{eq}^{29.3°\,C.}$ is the equilibrium or saturation concentration at the exit of the nuclei generator.

The stream of solution and small crystals issuing from the nuclei generator was then fed to a simple "growth zone". In this embodiment, the growth zone was a 28.5 m coil of 3 mm (inside diameter) polyethylene tubing. An additional 1 m length of Tygon® tubing of approximately 5 mm inside diameter was added at the end of the coil to conduct the product crystals and solution into a vacuum filter to separate the crystals from the solution. The average residence time of the solution and crystals in this tubing was 4.4 min, although it is likely that the average residence time of the crystals alone was longer because it is likely that they move somewhat more slowly than the solution through the tubing.

Ideally, the tubing used for the growth zone would be thermostated or have a temperature gradient imposed along its length. In this example, however, the temperature of the solution inside the tube was close to room temperature, so no thermostatting was used.

Figure 5:
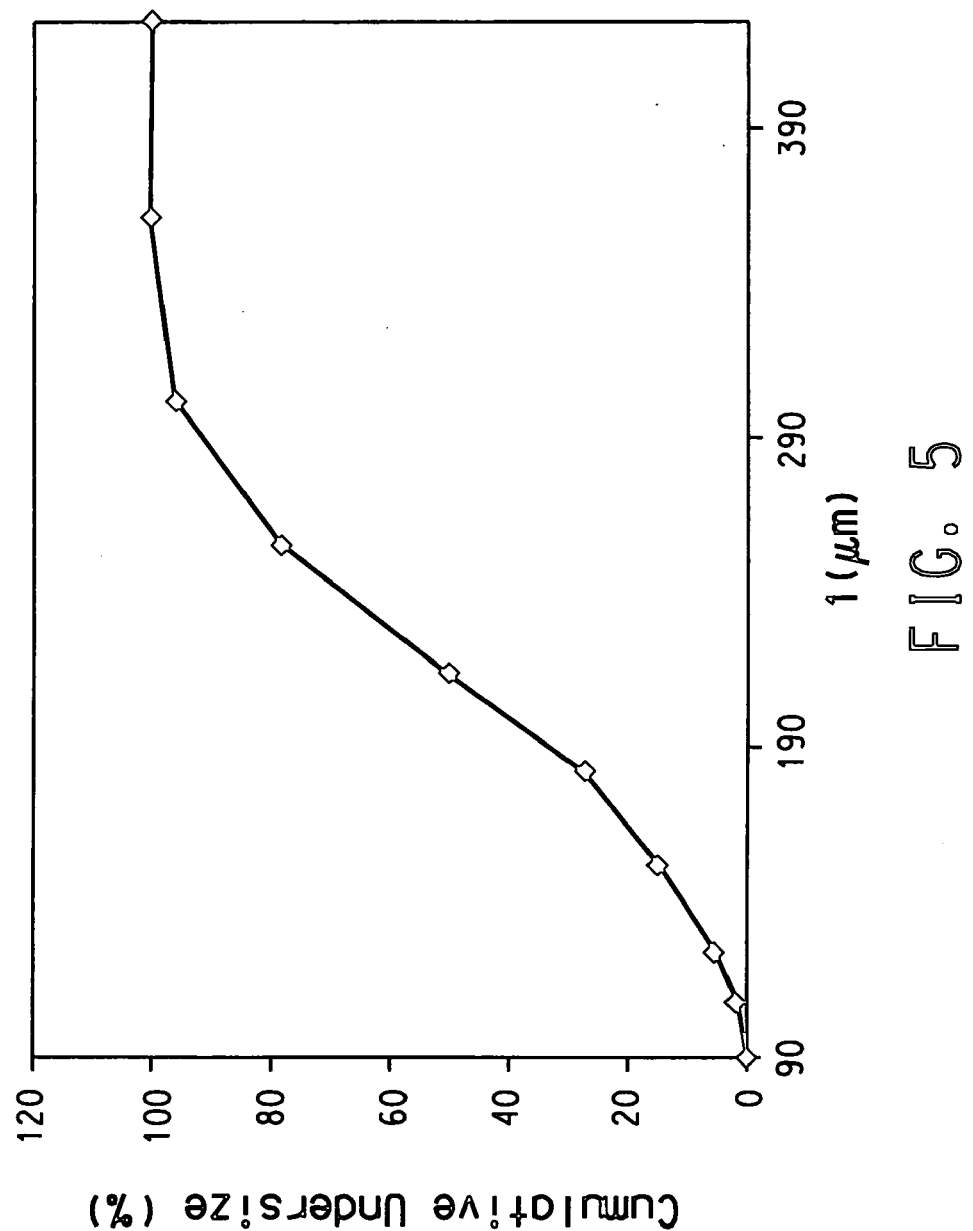
FIG. 5 shows the particle size distribution (PSD) of adipic acid crystals obtained as described in Example 3 as determined by sieving the crystals after drying. The median particle size is about 220 μm.

The crystals were harvested by vacuum filtration. The harvested crystals were unexpectedly large, very uniformly-sized crystals. These grew in a relatively short residence time as compared to crystals formed by using conventional methods. The PSD (FIG. 5) was exceptionally narrow. There were no fines and essentially all of the particles were between 80 and 380 µm. The crystals do appear to have a relatively high defect level, likely caused by the very high growth rates produced by these conditions.

Example 4

Controlled Supersaturation in the Crystal Growth Zone at Two Dilution Levels

The same apparatus and conditions were used in this example as in Example 1, with the exception that the supersaturation in the growth zone was reduced by diluting the suspension flow at the exit of the nuclei generator and before entering the growth zone. The intent was to determine if the particle size and quality are functions of growth zone supersaturation.

Dilution was accomplished by adding a metered stream of tempered water at the point where the nuclei generator and growth zone are joined. Previously in Example 2 under the same conditions, the stream exiting the nuclei generator was 29.3° C. To dilute the suspension without dissolving existing crystals, 29.3° C. water was added at a tubing "T" fitting between the nuclei generator and growth zone at a rate controlled with a peristaltic pump.

Figure 6A:
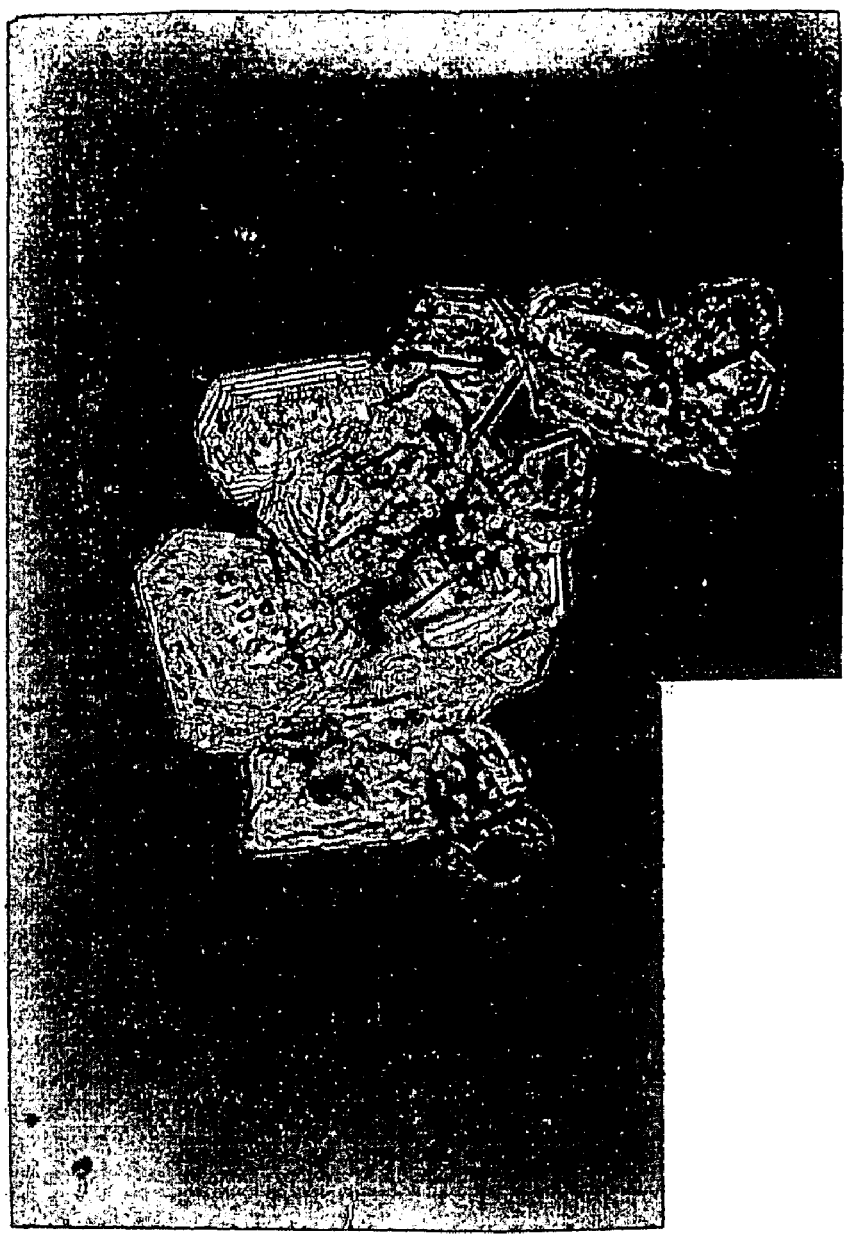
FIGS. 6a and 6b are optical micrographs taken with cross-polarized illumination, showing representative adipic crystals resulting from $\sigma_{diluted}/\sigma_{undiluted}$=0.5 and 0.75, respectively. σ is the dimensionless supersaturation defined $\sigma \equiv (c^*-c)/c^*$, where c is the actual concentration and c* is the equilibrium concentration or solubility. Characteristics of these crystals and those shown in FIG. 6 are the absence of fines, a very narrow PSD (See FIG. 5), a short residence time in the process, and crystal quality=f(supersaturation).
Figure 6B:

Two relative supersaturations were run. Expressed as ratios of the dimensionless supersaturation with and without dilution, these supersaturations were $\sigma_{diluted}/\sigma_{undiluted}=0.5$ and 0.75, respectively. That is, the dimensionless supersaturation in the growth zone for the first part of this example (4a) was nominally ½ the undiluted supersaturation of Example 3 and ¾ the undiluted supersaturation for the second part of this example (4b). These results are shown in FIGS. 6a and 6b. FIGS. 6a and 6b are optical micrographs taken with cross-polarized illumination, showing representative crystals resulting from $\sigma_{diluted}/\sigma_{undiluted}=0.5$ and 0.75, respectively. The crystals formed at the higher supersaturation are larger and have more defects, suggesting that growth at higher supersaturation is faster but produces more defects, as would be expected from normal crystallization practice (R. Davey and J. Garside, *From Molecules to Crystallizers: An Introduction to Crystallization*, Oxford University Press, Oxford, UK (2000)). These results indicate that the size and quality of the crystals produced by this process can be controlled by controlling the supersaturation in the growth zone.

Example 5

Template-Directed Nucleation on Self-Assembled Monolayer in Nuclei Generator

This example illustrates the method of the present invention applied to template-directed crystal nucleation. The prototype nuclei generator shown in FIG. 2 and in cross section in FIG. 3 was employed. A nucleation template in the form of a self-assembled monolayer was applied to the front surface of the nucleating surface. The nucleating surface was a thin (1.6 mm) piece of glass. The nucleation template was a self-assembled monolayer of aminopropyltrimethoxysilane (APS). The APS SAM was formed by immersing the clean glass surface into a 0.1 wt. % solution of APS in toluene for 10 min at 60° C. A glycine solution at 37° C. was fed to the apparatus at 30 mL/min. Solution concentration was 300 g glycine/1 kg water, corresponding to the saturation concentration at 35° C. Cooled water at 5° C. was fed to the cooling chamber behind the nucleation surface. Glycine crystals were collected on a tilted hydrophobic plastic surface as described in Example 1.

Figure 7:
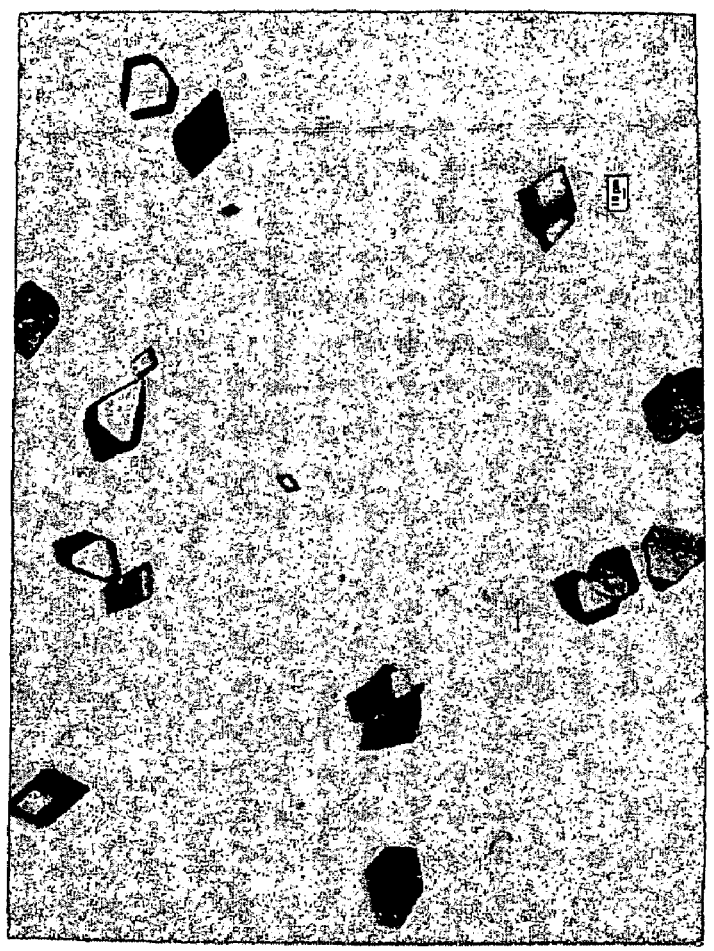
FIG. 7 shows a photomicrograph of glycine crystals grown as described in Example 5.

Crystals rapidly separated from solution and therefore with a minimum of growth after nucleation were 2–5 microns in size. Crystals that were allowed to grow by being in contact with supersaturated solution from the device are shown in the micrograph, FIG. 7. These exhibited an asymmetric bipyramidal shape. Characteristic glycine crystal habit is bipyramidal and symmetric. Evidently, glycine nucleation and initial growth were oriented by the SAM template on the nucleation template. Pyramid shaped crystals formed—essentially one half of the usual bipyramid. When the crystals were disengaged from the nucleation surface, they began to grow the other side of the characteristic bipyramid, but because this side had less time to grow, the bipyramids are asymmetric. The nucleation and growth of oriented pyramid shaped crystals was consistent with the observations of Landau et al. on the preferred nucleation of glycine on α-amino acid monolayers (E. M. Landau, S. G. Wolf, M. Levanon, L. Leiserowitz, M. Lahav & J. Sagiv, "Stereochemical Studies in Crystal Nucleation. Oriented Crystal Growth of Glycine at Interfaces Covered with Langmuir and Langmuir-Blodgeft Films of Resolved α-Amino Acids", *J. Am. Chem. Soc.*, (1989), 111:1436–1445).

Example 6

Preferential Nucleation of Selected Enantiomer of Conformationally Chiral Crystal This example illustrates the method of the present invention with respect to the selective crystallization of the amino acid glycine. The apparatus shown in FIG. 2 is used to perform the method of crystallization by passing a saturated solution of glycine over a self-assembled monolayer. A SAM nucleation template is formed with either relatively pure R-cysteine or relatively pure L-cysteine on gold substrates [or alternatively the cysteine is reacted with a bromine-terminated, 3-bromopropyltrichlorosilane SAM on a glass substrate to form an R or L-cysteine terminated SAM] in the nuclei generator. Pulsed ultrasound is used to dislodge the crystals from the monolayer, as in Example 1. The crystals nucleated on the R- and L-cysteine monolayers are clearly mirror images of each other and therefore predominantly opposite conformational enantiomers of glycine. The chirally asymmetric monolayer has preferentially nucleated only one enantiomer of the glycine crystals.

What is claimed is:

1. A process for generating crystals comprising:
    (a) providing a flow of a first saturated solution past a front surface of a nucleation surface in a solution chamber and forming the flow of the first saturated solution into a flat thin sheet of solution adjacent to the front surface of the nucleation surface in the solution chamber;
    (b) causing a plurality of crystals to form on the front surface of the nucleation surface;
    (c) growing the crystals for a predetermined time to form a plurality of crystals of a desired size;
    (d) dislodging and releasing the plurality of crystals from the nucleation surface into the first saturated solution in the solution chamber;
    (e) passing the dislodged crystals and first saturated solution away from the nucleation surface; and
    (f) repeating the growing step (c) and the dislodging and releasing step (d) at least one time.

2. The process of claim 1 wherein step (b) comprises i) cooling the nucleation surface with a chilled liquid contacting a back surface of the nucleation surface in a cooling chamber thereby causing supersaturation of the solution at the front surface of the nucleation surface, ii) evaporating solvent from the first saturated solution, or iii) adding chemical reactants, anti-solvent materials, or salt(s) to the first saturated solution.

3. The process of claim 1, wherein step (d) comprises subjecting the nucleation surface to an ultrasonic pulse applied to the chilled liquid of step (b) or to the first saturated solution.

4. The process of claim 1, wherein
    the flow of the first saturated solution in step (a) is directionally aligned with the force of gravity; and wherein the passing of the dislodged crystals into the first saturated solution of step (e) is directionally aligned with the force of gravity.

5. A process for growing crystals comprising:
    (a) generating dislodged crystals according to claim 1;
    (b) mixing the first saturated solution and dislodged crystals with a second saturated solution to form a third saturated solution;
    (c) treating the third saturated solution to form a supersaturated solution;
    (d) passing the supersaturated solution of step (c) through a growth zone for a predetermined time to grow the dislodged crystals to a desired size under conditions of plug flow; and
    (e) separating the dislodged crystals of step (d) from the supersaturated solution while maintaining the third saturated solution at least saturated.

6. A process for growing crystals comprising:
    (a) generating dislodged crystals according to claim 1;
    (b) treating the saturated solution and crystals to form a supersaturated solution;
    (c) passing the cooled supersaturated solution of step (c) through a growth zone for a predetermined time to grow the dislodged crystals to a desired size under conditions of plug flow; and
    (d) separating the dislodged crystals of step (c) while maintaining the solution at least saturated.

7. The process of claim 5 or 6 wherein step (b) comprises i) cooling, ii) evaporating solvent from the third saturated solution, or iii) adding chemical reactants, anti-solvent materials, or salt(s) to the third saturated solution.

8. A crystal generator comprising:
    (a) an inlet for flowing a crystal solution liquid, the inlet having an exit end;
    (b) a solution chamber attached to the exit end of the inlet,
    (c) a nucleation surface forming one surface of the solution chamber, the nucleation surface having a front surface for growing a plurality of crystals and a back surface;
    (d) a cooling chamber adjacent to the back surface of the nucleation surface for cooling the nucleation surface with a chilled liquid contacting the back surface of the nucleation surface, the cooling chamber having a liquid entrance port and a liquid exit port;
    (e) an ultrasonic horn arranged to vibrate the liquid contacting the nucleation surface;
    (f) a horn driver assembly connected to the ultrasonic horn for energizing the horn for a predetermined time and repeated at a predetermined interval to vibrate the liquid contacting the nucleation surface to dislodge the plurality of crystals from the nucleation surface; and
    (g) an outlet from the solution chamber for flowing the solution of the crystal solution liquid and crystals contained therein away therefrom.

9. A crystal generator comprising:
    (a) a diverging inlet diffuser for flowing a solution of the crystal media, the diffuser having a width at an exit end larger than at entrance end of the diffuser;
    (b) a solution chamber attached to the exit end of the inlet diffuser, the solution chamber shaped to form a flat thin sheet of flowing solution, the thickness and width of the solution chamber matching the thickness and width of the exit end of the inlet diffuser;

(c) a nucleation surface forming one surface of the solution chamber width, the nucleation surface having a front surface for growing a plurality of crystals and a back surface;
(d) a cooling chamber adjacent to the back surface of the nucleation surface for cooling the nucleation surface with a chilled liquid contacting the back surface of the nucleation surface, the cooling chamber having a liquid entrance port and a liquid exit port;
(e) an ultrasonic horn extending or penetrating into the cooling chamber;
(f) a horn driver assembly connected to the ultrasonic horn for energizing the horn, thereby vibrating the chilled liquid and the nucleation surface contacted by the liquid for a predetermined time and repeated at a predetermined interval to dislodge the plurality of crystals from the nucleation surface;
(g) a converging outlet diffuser for flowing a solution of the crystal media and crystals contained therein away from the solution chamber, the diffuser having a thickness and a width at an entrance end of the diffuser, the thickness and width of the entrance end of the diffuser approximately matching the thickness and width of the solution chamber.

10. The crystal generator of claims 8 or 9, wherein the nucleation surface comprises a molecular nucleation template.

11. The crystal generator of claim 10 wherein the molecular nucleation template comprises a surfactant film, a self-assembled monolayer, or a molecularly imprinted polymer.

* * * * *